United States Patent

Yau et al.

(10) Patent No.: US 11,061,146 B2
(45) Date of Patent: Jul. 13, 2021

(54) NANOSHEET RADIATION DOSIMETER

(71) Applicant: International Business Machines Corporation, Armonk, NY (US)

(72) Inventors: Jeng-Bang Yau, Yorktown Heights, NY (US); Alexander Reznicek, Troy, NY (US); Karthik Balakrishnan, Scarsdale, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 16/256,409

(22) Filed: Jan. 24, 2019

(65) Prior Publication Data

US 2020/0241149 A1    Jul. 30, 2020

(51) Int. Cl.
*G01T 1/02*        (2006.01)
*H01L 21/02*      (2006.01)
*H01L 29/66*      (2006.01)
*H01L 29/78*      (2006.01)

(52) U.S. Cl.
CPC ........ *G01T 1/026* (2013.01); *H01L 21/02532* (2013.01); *H01L 21/02603* (2013.01); *H01L 29/66545* (2013.01); *H01L 29/7845* (2013.01)

(58) Field of Classification Search
CPC .............. G01T 1/026; H01L 21/02532; H01L 21/02603; H01L 29/66545; H01L 29/7845
USPC ........................................................ 257/429
See application file for complete search history.

(56) References Cited

U.S. PATENT DOCUMENTS

| | | |
|---|---|---|
| 6,610,548 B1 | 8/2003 | Ami et al. |
| 6,852,575 B2 | 2/2005 | Bojarczuk et al. |
| 7,135,699 B1 | 11/2006 | Atanackovic |
| 7,652,268 B2 | 1/2010 | Patel |
| 8,080,805 B2 | 12/2011 | Gordon et al. |
| 8,742,398 B2 | 6/2014 | Klem et al. |
| 8,895,995 B2 | 11/2014 | Cai et al. |
| 9,508,829 B1 * | 11/2016 | Cheng ............... H01L 29/66742 |
| 9,570,609 B2 | 2/2017 | Obradovic et al. |
| 9,947,804 B1 | 4/2018 | Frougier et al. |
| 2007/0012988 A1 * | 1/2007 | Bhattacharyya ........................... H01L 27/11568 257/314 |

(Continued)

FOREIGN PATENT DOCUMENTS

WO     2009087104 A1    7/2009

OTHER PUBLICATIONS

Schwank, J. R., et al., "Radiation Effects in MOS Oxides", IEEE Transactions on Nuclear Science, Aug. 2008, pp. 1833-1853, vol. 55, No. 4.

(Continued)

*Primary Examiner* — Dzung Tran
(74) *Attorney, Agent, or Firm* — Scully, Scott, Murphy & Presser, P.C.; L. Jeffrey Kelly, Esq.

(57) ABSTRACT

A semiconductor radiation monitor is provided that includes a charge storage region composed of a dielectric material nanosheet, such as, for example an epitaxial oxide nanosheet, which is sandwiched between a top semiconductor nanosheet and a bottom semiconductor nanosheet. A functional gate structure is located above the top semiconductor nanosheet and beneath the bottom semiconductor nanosheet.

9 Claims, 10 Drawing Sheets

(56) References Cited

U.S. PATENT DOCUMENTS

| | | | |
|---|---|---|---|
| 2007/0134888 A1* | 6/2007 | Swift | H01L 29/7923 438/459 |
| 2008/0017934 A1* | 1/2008 | Kim | H01L 29/0657 257/401 |
| 2015/0295084 A1* | 10/2015 | Obradovic | H01L 29/42392 257/347 |
| 2016/0020305 A1* | 1/2016 | Obradovic | H01L 29/7391 257/39 |
| 2017/0271514 A1* | 9/2017 | Kittl | H01L 21/32055 |
| 2018/0331232 A1* | 11/2018 | Frougier | H01L 29/42392 |

OTHER PUBLICATIONS

Zahedifar, M., et al., "Synthesis of CaSO4: Mn nanosheets with high thermoluminescence sensitivity", Applied Radiation and Isotopes, Apr. 7, 2011, pp. 1002-1006, 69.

* cited by examiner

NANOSHEET RADIATION DOSIMETER

BACKGROUND

The present application relates to a radiation monitor and a method of forming the same. More particularly, the present application relates to a semiconductor radiation monitor (i.e., dosimeter) that includes a charge storage region that is sandwiched between a top semiconductor nanosheet and a bottom semiconductor nanosheet.

Radiation may come in various forms, including, for example, as X-rays, Y-rays, or beta-rays. There are various types of radiation monitors that may be used to determine an amount of radiation exposure, such as ionization detectors, Geiger counters, and thermoluminescent detectors (TLDs). Geiger counters and ionization detectors may determine and display a dose rate (for example, in mRad/hr) or an integrated dose (for example, in Rads) of radiation exposure in real time. Alarm set points may be programmed based on the dose rate or the integrated dose. A Geiger counter or ionization detector may communicate with a computer for data logging or firmware updates. However, Geiger counters and ionization detectors may be relatively expensive. TLDs allow determination of a dose of radiation based on emission of photons in response to application of heat. TLDs may be relatively inexpensive, but may only be read after a period of exposure time, typically between one and three months. A degree of radiation exposure may only be determined after-the-fact using a TLD; real time dose information is not available.

One type of semiconductor radiation monitoring device may include a p-channel metal-oxide-semiconductor field effect transistor (MOSFET) transistor structure having a gate oxide layer fabricated on bulk silicon. Holes may be induced in the FET structure by ionizing radiation exposure and trapped in the gate oxide by a voltage applied to the gate, and the threshold voltage ($V_{th}$) of the transistor may change according to the amount of trapped holes. However, in order to measure the change in $V_{th}$, a negative voltage is applied to the gate, which may trigger the release of the holes trapped in the gate oxide via direct or trap-assisted tunneling. Therefore, electrical readout of the $V_{th}$ shift to determine the radiation dose in such a FET-type dosimeter may cause a loss of the radiation-induced charge, leading to incorrect long-term total dose data. Further, the trapping voltage and the readout voltage are both applied at the gate, they may not be applied at the same time, so real-time information regarding a dose of radiation may not be obtained.

Another type of semiconductor radiation monitoring device includes a fully depleted semiconductor-on-insulator (FDSOI) dosimeter. One example of an FDSOI dosimeter includes a buried insulator layer disposed on a semiconductor substrate, the buried insulator layer includes a plurality of charge traps. A semiconductor layer is disposed on the buried insulating layer. A second insulator layer is disposed on the semiconductor layer. A gate conducting layer is disposed on the second insulator layer, and one or more side contacts are electrically connected to the semiconductor layer. A back contact is electrically connected to the semiconductor substrate, the back contact is configured to receive a backgate voltage during a radiation exposure by the radiation monitor. The backgate voltage includes a positive bias across the buried insulator layer that is configured to trap an amount of positive charge in the charge traps in the buried insulator layer in response to the radiation exposure by the radiation monitor, wherein the amount of positive charge trapped in the charge traps in the buried insulator layer is used to determine the amount of the radiation exposure. The FDSOI dosimeter is capable of real time readout, with retention, but is limited in density due to its planar structure and detection of lower dose (equal to, or lesser than, 100 rad) at the expense of larger device area.

There is thus a need for providing a semiconductor radiation monitor that is capable of real time readout, with retention, but overcomes the aforementioned drawbacks of prior art FDSOI dosimeters.

SUMMARY

A semiconductor radiation monitor is provided that includes a charge storage region composed of a dielectric material nanosheet, such as, for example an epitaxial oxide nanosheet, which is sandwiched between a top semiconductor nanosheet and a bottom semiconductor nanosheet. A functional gate structure is located above the top semiconductor nanosheet and beneath the bottom semiconductor nanosheet.

In one aspect of the present application, a semiconductor radiation monitor (i.e., dosimeter) is provided. In one embodiment, the semiconductor radiation monitor includes a nanosheet stack including a charge storage dielectric material nanosheet sandwiched between a first silicon channel material nanosheet and a second silicon channel material nanosheet, and suspended above a semiconductor substrate. A functional gate structure is located beneath the first silicon channel material nanosheet and above the second silicon channel material nanosheet.

In another aspect of the present application, a method of forming a semiconductor radiation monitor (i.e., dosimeter) is provided. In one embodiment, the method includes forming a nanosheet material stack of, and from bottom to top, a sacrificial semiconductor material nanosheet, a first silicon channel material nanosheet, an epitaxial oxide nanosheet, and a second silicon channel material nanosheet on a surface of a semiconductor substrate and beneath a sacrificial gate structure and a dielectric spacer material layer. The sacrificial semiconductor material nanosheet is then recessed to provide a gap between the first silicon channel material nanosheet and the semiconductor substrate. Next, an inner dielectric spacer is formed in the gap and contacts a sidewall of the recessed sacrificial semiconductor channel material nanosheet. A source/drain structure is then formed on each side of the nanosheet material stack and contacting a sidewall of the first silicon channel material nanosheet and a sidewall of the second silicon channel material nanosheet. The sacrificial gate structure is then removed to provide an upper gate cavity, and thereafter the recessed sacrificial semiconductor material nanosheet is removed to provide a lower gate cavity. A functional gate structure is then formed beneath the first silicon channel material nanosheet and in the lower gate cavity, and above the second silicon channel material nanosheet and in the upper gate cavity portion.

In another embodiment, the method includes forming a nanosheet material stack of, and from bottom to top, a first sacrificial silicon germanium alloy nanosheet having a first germanium content, a first silicon channel material nanosheet, a second sacrificial silicon germanium alloy nanosheet having a second germanium content that is greater than the first germanium content, and a second silicon channel material nanosheet on a surface of a semiconductor substrate and beneath a sacrificial gate structure and a dielectric spacer material layer. Next, the first and second sacrificial silicon germanium alloy nanosheets are recessed to provide a first gap between the first silicon channel material nanosheet and the semiconductor substrate, and a second gap, which is larger than the first gap, between the first and second silicon channel material nanosheets. An inner dielectric spacer is them formed in the first and second gaps, and thereafter a source/drain structure is formed on each side of the nanosheet material stack and contacting a sidewall of the first silicon channel material nanosheet and a sidewall of the second silicon channel material nanosheet. Next, the sacrificial gate structure is removed to provide an upper gate cavity, and thereafter the recessed second sacrificial silicon germanium alloy nanosheet is removed. A dielectric oxide is then filled into the area previously occupied by the recessed second sacrificial silicon germanium alloy nanosheet. Next, the recessed first sacrificial silicon germanium alloy nanosheet is removed to provide a lower gate cavity, and thereafter a functional gate structure is formed beneath the first silicon channel material nanosheet and in the lower gate cavity, and above the second silicon channel material nanosheet and in the upper gate cavity portion.

DETAILED DESCRIPTION

Figure 1:
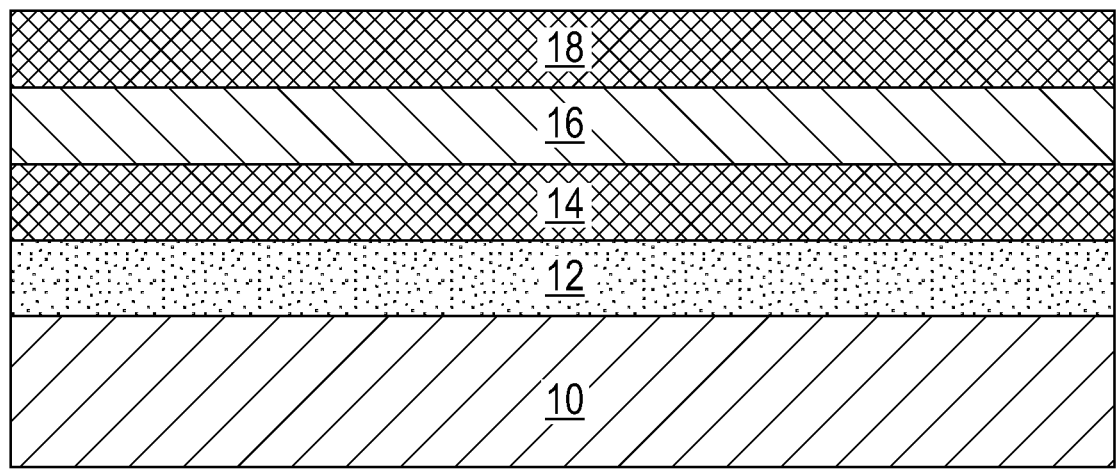
FIG. 1 is a cross sectional view of an exemplary semiconductor radiation monitor (i.e., dosimeter) of the present application and during an early stage of fabrication, the exemplary semiconductor radiation monitor including a material stack structure of, and from bottom to top, a sacrificial semiconductor material layer, a first silicon channel material layer, an epitaxial oxide layer, and a second silicon channel material layer located on a surface of a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As mentioned above, the present application provides a semiconductor radiation monitor that includes a charge storage region composed of a dielectric material nanosheet, such as, for example an epitaxial oxide nanosheet, which is sandwiched between a top semiconductor nanosheet and a bottom semiconductor nanosheet. A functional gate structure is located above the top semiconductor nanosheet and beneath the bottom semiconductor nanosheet. The semiconductor radiation monitor of the present application provides instantaneous readout of a radiation dose through simple electrical measurement (wired or wireless) as compared to conventional TLDs, which require extended post radiation sample processing. The semiconductor radiation monitor of the present application can provide a direct change in threshold voltage measurement by simple I-V or C-V measurement for radiation dose calculation. The semiconductor radiation monitor of the present application can be fabricated utilizing CMOS processing steps and requires no new processes to be developed, which facilitates device scaling with advantages such as embedded/implantable applications. In commercial radiation sensing field effect transistors (RADFETs), support electronics are required to maintain specific current/voltage for change in threshold voltage readouts. These readouts contain a component dependent on the biasing current, which limits device scalability.

Moreover, the charge storage region, i.e., the dielectric material nanosheet, decouples the charge storage part from the radiation detection/readout which enables non-destructive electrical readout. In bulk Si radiation dosimeters (e.g., RADFETs), the radiation detection is conducted in the front gate/oxide/Si where the charge is stored. The repetitive readout voltage may eventually induce leakage of stored charge.

Furthermore, the semiconductor radiation monitor of the present application has a long (compared to radiation treatment time) charge retention time (at least 30 days), enabling long-term radiation dose tracking.

Referring first to FIG. 1, there is illustrated an exemplary semiconductor radiation monitor (i.e., dosimeter) of the present application and during an early stage of fabrication, the exemplary semiconductor radiation monitor including a material stack structure of, and from bottom to top, a sacrificial semiconductor material layer 12, a first silicon channel material layer 14, an epitaxial oxide layer 16, and a second silicon channel material layer 18 located on a surface of a semiconductor substrate 10. In accordance with this embodiment of the present application, the first silicon channel material layer 14, the epitaxial oxide layer 16, and the second silicon channel material layer 18 of the material stack structure are lattice matched.

The semiconductor substrate 10 that can be employed in the present application includes at least one semiconductor material that has semiconducting properties. Examples of semiconductor materials that can be used as the semiconductor substrate 10 include, for example, silicon (Si), a silicon germanium (SiGe) alloy, a silicon germanium carbide (SiGeC) alloy, germanium (Ge), III/V compound semiconductors or II/VI compound semiconductors. In one embodiment, the semiconductor substrate 10 is a bulk semiconductor substrate. The term "bulk semiconductor substrate" denotes a substrate that is composed entirely of one or more semiconductor materials. In one example, the bulk semiconductor substrate is composed entirely of Si.

In some embodiments, the semiconductor substrate 10 is composed of a semiconductor-on-insulator (SOI) substrate. An SOI substrate typically includes a handle substrate, an insulator layer and a topmost semiconductor material layer. In some embodiments, the handle substrate of the SOI substrate may include a semiconductor material, as described above. In other embodiments, the handle substrate may be omitted, or the handle substrate may be composed of a conductive material and/or an insulator material. The insulator layer of the SOI substrate may include a crystalline or non-crystalline dielectric material. In one example, the insulator layer of the SOI substrate may be composed of silicon dioxide and/or boron nitride. The topmost semiconductor layer of the SOI substrate is composed of a semiconductor material, as defined above.

The material stack structure (12, 14, 16, 18), as defined above, is then formed on the semiconductor substrate 10. As mentioned above, the material stack structure includes a sacrificial semiconductor material layer 12, a first silicon channel material layer 14, an epitaxial oxide layer 16, and a second silicon channel material layer 18 stacked one atop the other.

The sacrificial semiconductor material layer 12 is composed of a semiconductor material which differs in composition from at least an upper portion of the semiconductor substrate 10 and is other than silicon. In one embodiment, the sacrificial semiconductor material layer 12 is composed of a silicon germanium alloy. The sacrificial semiconductor material layer 12 can be formed utilizing an epitaxial growth (or deposition process) as defined in greater detail herein below.

The first and second silicon channel material layers 14 and 18 have a different etch rate than the sacrificial semiconductor material layer 12. The first and second silicon channel material layers 14 and 18 can be formed utilizing an epitaxial growth (or deposition process) as defined in greater detail herein below.

The epitaxial oxide layer 16, which is sandwiched between the first silicon channel material layer 14 and the second silicon channel material layer 18, is a dielectric material that can store positive charges upon use. The epitaxial oxide layer 16 may be selected to have a lattice dimension substantially similar (i.e., ±5%) to the lattice dimension of the first and second silicon channel material layers (14, 16), thus the epitaxial oxide layer 16 is said to be lattice matched to the first and second silicon channel material layers (14, 18). The epitaxial oxide layer 16 is epitaxially deposited, as defined below. Examples of epitaxial oxides that are suitable for use as the epitaxial oxide layer 16 may include binary oxides, such as, e.g., lanthanum (II) oxide ($La_2O_3$) gadolinium(III)-oxide ($Gd_2O_3$), dysprosium(III)-oxide ($Dy_2O_3$), holmium(III) oxide ($Ho_2O_3$), erbium (III) oxide ($Er_2O_3$), thulium (III) oxide ($Tm_2O_3$), lutetium(III) oxide ($Lu_2O_3$) or cerium (IV) oxide ($CeO_2$), ternary oxides including a rare earth metal, such as e.g., Gd, Er, Nd, La and Y forming oxides such as, e.g., lanthanum-yttrium oxide (($La_xY_{1-x})_2O_3$), gadolinium-erbium oxide (($Gd_xEr_{1-x})_2O_3$), neodymium-erbium oxide (($Nd_xEr_{1-x})_2O_3$), neodymium-gadolinium oxide (($Nd_xGd_{1-x})_2O_3$), lanthanum-erbium oxide (($La_xEr_{1-x})_2O_3$), or any combination thereof. In one embodiment, the epitaxial oxide layer 16 is composed of ($La_xY_{1-x})_2O_3$ alloy in which x is 0.33.

The thickness of the epitaxial oxide layer 16 can be determined by satisfying the requirement of negligible loss of stored charge by tunneling into the first and second silicon channel material layers 14 and 18. The tunneling between a silicon channel material layer and the epitaxial oxide layer 16 can be described by the Fowler-Nordheim model. According to this model, and to keep the tunneling current below a desired level, e.g., $1E^{-8}$ Amperes/cm$^2$, the epitaxial oxide field must be lower than about 6 MV/cm. In the present application, the thickness of the epitaxial oxide layer 16 is from 10 nm to 500 nm. In some embodiments, the thickness of the epitaxial oxide layer 16 is from 10 nm to 100 nm, while in other embodiments the thickness of the epitaxial oxide layer 16 is from 10 nm to 50 nm.

Material stack structure (12, 14, 16, 18) can be formed by sequential epitaxial growth of the sacrificial semiconductor material layer 12, the first silicon channel material layer 14, the epitaxial oxide layer 16, and the second silicon channel material layer 18. Following epitaxial growth of the second silicon channel material layer 18, a patterning process may be used to provide the material stack structure (12, 14, 16, 18) shown in FIG. 1. Patterning may be performed by lithography and etching or any other patterning method known to those skilled in the art including, for example, a sidewall-image transfer (SIT) process.

The terms "epitaxially growing and/or depositing" and "epitaxially grown and/or deposited" mean the growth of a material (e.g., semiconductor material or epitaxial oxide) on a growth surface of another material, in which the material being grown has the same crystalline characteristics as the material of the growth surface. In an epitaxial deposition process, the chemical reactants provided by the source gases are controlled and the system parameters are set so that the depositing atoms arrive at the growth surface of a material with sufficient energy to move around on the growth surface and orient themselves to the crystal arrangement of the atoms of the growth surface. Therefore, an epitaxial material has the same crystalline characteristics as the growth on surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the various material layers (i.e., the sacrificial semiconductor material layer 12, the first silicon channel material layer 14, the epitaxial oxide layer 16 and the second silicon channel material layer 18) can be performed utilizing any well known precursor gas or gas mixture. Carrier gases like hydrogen, nitrogen, helium and argon can be used.

The term "material stack structure" denotes a continuous structure including a pair of vertical sidewalls that are parallel to each other. As used herein, a surface is "vertical" if there exists a vertical plane from which the surface does not deviate by more than three times the root mean square roughness of the surface. Each layer within the material stack structure (i.e., the sacrificial semiconductor material layer 12, the first silicon channel material layer 14, the epitaxial oxide layer 16 and the second silicon channel material layer 18) may have a thickness from 5 nm to 12 nm. The thickness of each layer within the material stack structure may be the same or different.

Figure 2:
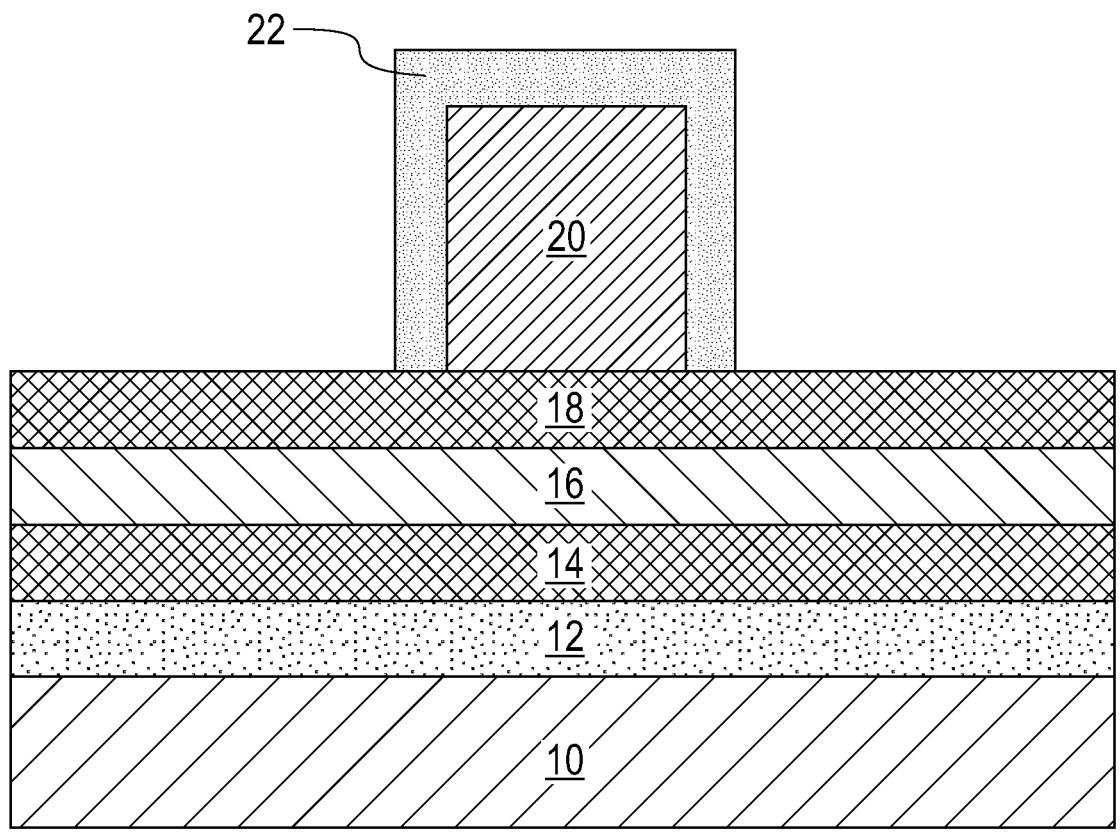
FIG. 2 is a cross sectional view of the exemplary semiconductor radiation monitor of FIG. 1 after forming a sacrificial gate structure and a dielectric spacer material layer on a surface of the material stack structure.

Referring now to FIG. 2, there is illustrated the exemplary semiconductor radiation monitor of FIG. 1 after forming a sacrificial gate structure 20 and a dielectric spacer material layer 22 on a surface of the material stack structure (12, 14, 16, 18). The sacrificial gate structure 20 is located on a first side and a second side of the material stack structure, and spans across a topmost surface of a portion of the material stack structure. The sacrificial gate stack 20 thus straddles over a portion of the material stack structure. A dielectric spacer material layer 22 is present on the exposed surfaces of the sacrificial gate structure 20.

The sacrificial gate structure 20 may include a single sacrificial material or a stack of two or more sacrificial materials (i.e., the sacrificial gate structure 20 includes at least one sacrificial material). In one embodiment, the at least one sacrificial material comprises, from bottom to top, a sacrificial gate dielectric material, a sacrificial gate material and a sacrificial dielectric cap. In some embodiments, the sacrificial gate dielectric material and/or the sacrificial dielectric cap can be omitted and only a sacrificial gate material is formed. The at least one sacrificial material can be formed by forming a blanket layer (or layers) of a material (or various materials) and then patterning the material (or various materials) by lithography and an etch. In one embodiment, the at least one sacrificial material can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate dielectric material. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the sacrificial gate structure 20.

The dielectric spacer material layer 22 can be formed by deposition of a dielectric spacer material and then etching the dielectric spacer material. One example of a dielectric spacer material that may be employed in the present application is silicon nitride. The deposition process that can be employed in providing the dielectric spacer material includes, for example, chemical vapor deposition (CVD), plasma enhanced chemical vapor deposition (PECVD), or physical vapor deposition (PVD). The etch used to etch the deposited dielectric spacer material may comprise a dry etching process such as, for example, reactive ion etching.

Figure 3:
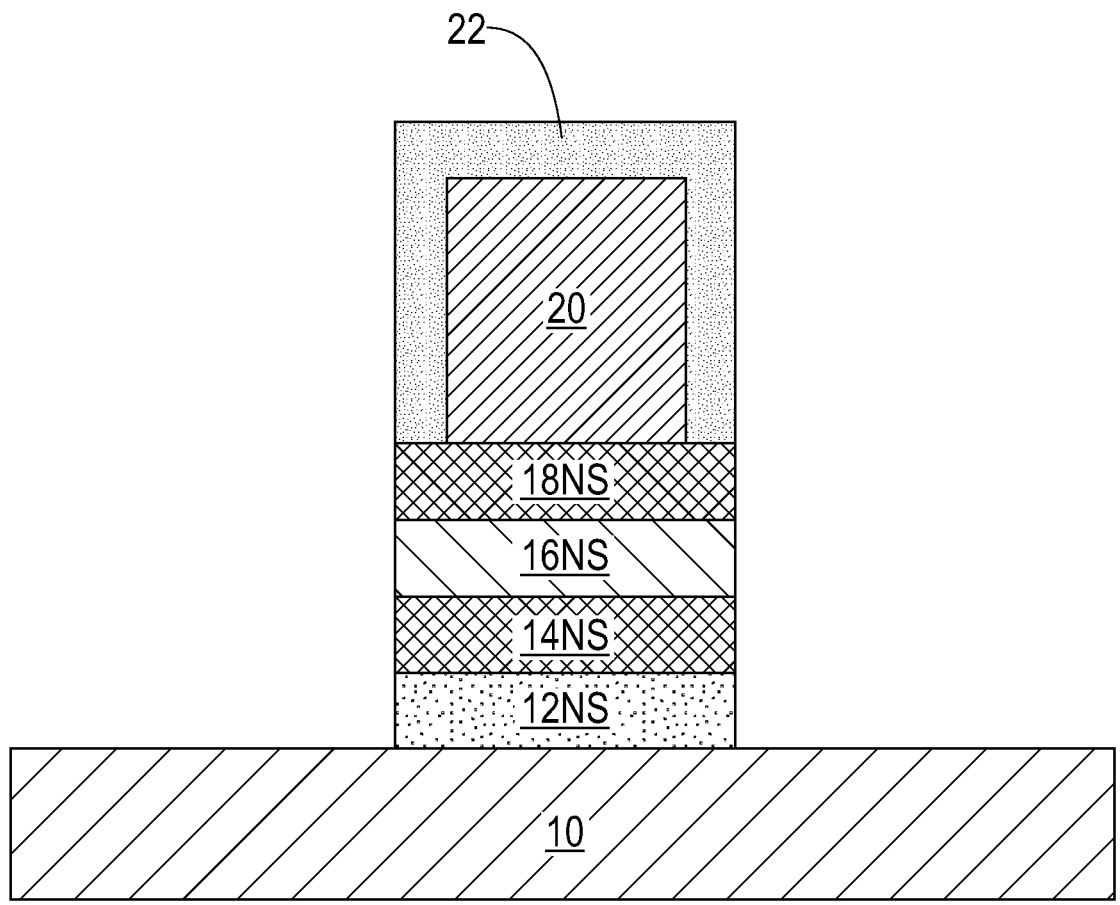
FIG. 3 is a cross sectional view of the exemplary semiconductor radiation monitor of FIG. 2 after removing physically exposed portions of the material stack structure that are not protected by the sacrificial gate structure and the dielectric spacer material layer to provide a nanosheet material stack of, and from bottom to top, a sacrificial semiconductor material nanosheet, a first silicon channel material nanosheet, an epitaxial oxide nanosheet, and a second silicon channel material nanosheet located beneath the sacrificial gate structure and the dielectric spacer material layer.

Referring now to FIG. 3, there is illustrated the exemplary semiconductor radiation monitor of FIG. 2 after removing physically exposed portions of the material stack structure (12, 14, 16, 18) that are not protected by the sacrificial gate structure 20 and the dielectric spacer material layer 22 to provide a nanosheet material stack of, and from bottom to top, a sacrificial semiconductor material nanosheet 12NS, a first silicon channel material nanosheet 14NS, an epitaxial oxide nanosheet 16NS, and a second silicon channel material nanosheet 18NS located beneath the sacrificial gate structure 20 and the dielectric spacer material layer 22. The sacrificial semiconductor material nanosheet 12NS, the first silicon channel material nanosheet 14NS, the epitaxial oxide nanosheet 16NS, and the second silicon channel material nanosheet 18NS represent non-removed material layer portions of the material stack structure (12, 14, 16, 18).

The removal of the physically exposed portions of the material stack structure (12, 14, 16, 18) not covered by the sacrificial gate structure 20 and the dielectric spacer material layer 22 can be performed utilizing an anisotropic etching process such as, for example, reactive ion etching (RIE). A portion of the material stack structure (12, 14, 16, 18) remains beneath the sacrificial gate structure 20 and the dielectric spacer material layer 22. The remaining portion of the material stack structure (12, 14, 16, 18) that is presented beneath the sacrificial gate structure 20 and the dielectric spacer material layer 22 can be referred to as a nanosheet material stack. As stated above, the nanosheet material stack structure includes a sacrificial semiconductor material nanosheet 12NS, a first silicon channel material nanosheet 14NS, an epitaxial oxide nanosheet 16NS, and a second silicon channel material nanosheet 18NS.

Each nanosheet, i.e., the sacrificial semiconductor material nanosheet 12NS, the first silicon channel material nanosheet 14NS, the epitaxial oxide nanosheet 16NS, and the second silicon channel material nanosheet 18NS, that constitutes the nanosheet material stack has a thickness as mentioned above for the individual layers of the material stack, and a width from 30 nm to 200 nm. At this point of the present application and as illustrated in FIG. 3, the sidewalls of the nanosheets (i.e., the sacrificial semiconductor material nanosheet 12NS, the first silicon channel material nanosheet 14NS, the epitaxial oxide nanosheet 16NS, and the second silicon channel material nanosheet 18NS) are vertically aligned to each other as well as to an outmost sidewall of the dielectric spacer material layer 22.

Figure 4:
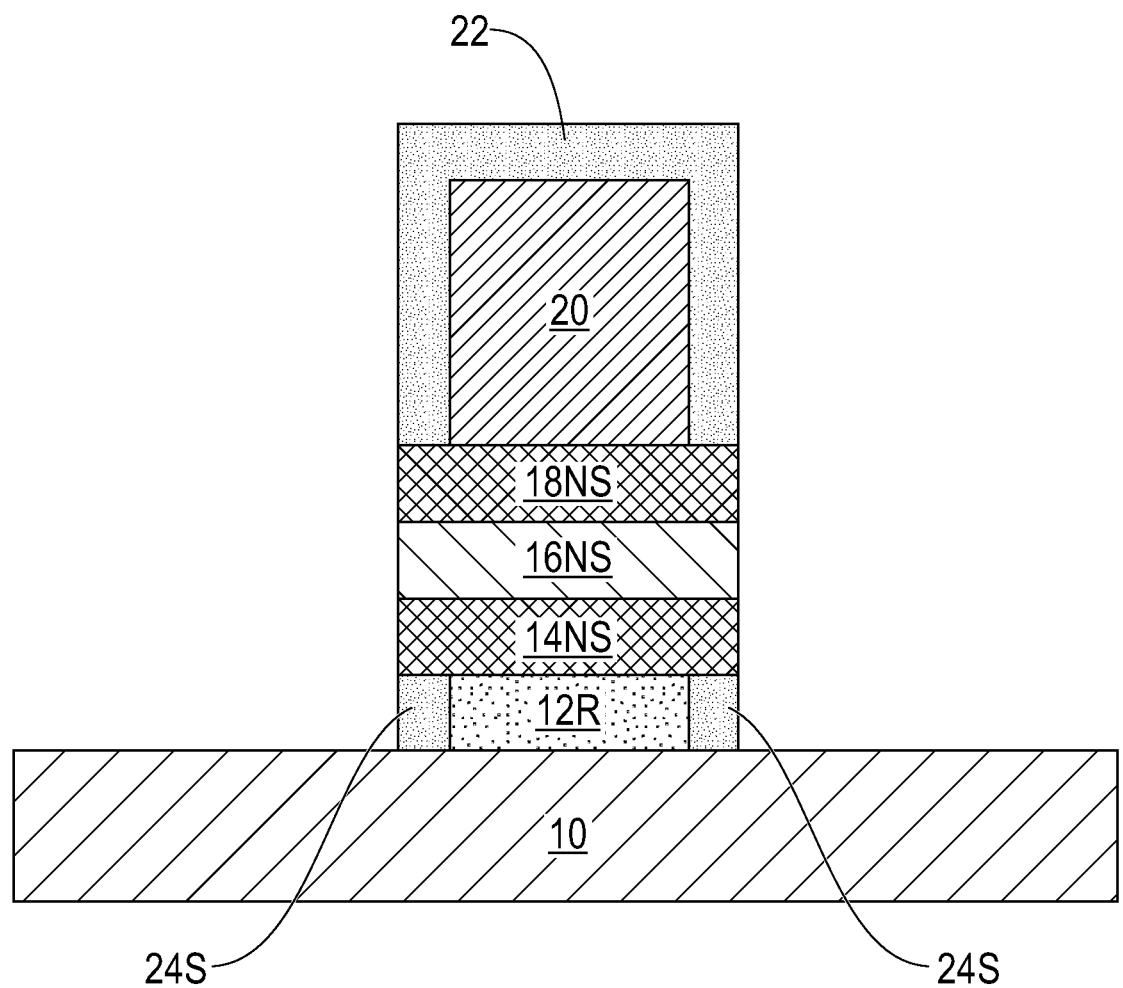
FIG. 4 is a cross sectional view of the exemplary semiconductor radiation monitor of FIG. 3 after recessing the sacrificial semiconductor material nanosheet and forming an inner dielectric spacer on exposed sidewalls of the recessed sacrificial semiconductor material nanosheet.

Referring now to FIG. 4, there is illustrated the exemplary semiconductor radiation monitor of FIG. 3 after recessing the sacrificial semiconductor material nanosheet 12NS and forming an inner dielectric spacer 24S on exposed sidewalls of the recessed sacrificial semiconductor material nanosheet 12R. The recessed sacrificial semiconductor material nanosheet is designated as element 12R in the drawings of the present application. The recessed sacrificial semiconductor material nanosheet 12R has a width that is less than the original width of the sacrificial semiconductor material nanosheet 12NS. The recessing of the sacrificial semiconductor material nanosheet 12NS provides a gap (not specifically shown) between the first silicon channel material nanosheet 14NS and the semiconductor substrate 10. The recessing of the sacrificial semiconductor material nanosheet 12NS may be performed utilizing a lateral etching process that is selective in removing physically exposed end portions of the sacrificial semiconductor material nanosheet 12NS relative to the first and second silicon channel material nanosheet (14NS, 18NS), and the epitaxial oxide nanosheet 16NS.

The inner dielectric spacer 24S is formed in the gap that is formed by the recessing of the sacrificial semiconductor material nanosheet 12NS. The inner dielectric spacer 24S is formed by deposition of a dielectric spacer material and etching the deposited dielectric spacer material. The dielectric spacer material that provides the inner dielectric spacer 24S may be the same as, or different from, the dielectric spacer material that provides the dielectric spacer material layer 22. As is shown, the inner dielectric spacer 24S has an innermost sidewall that directly contacts a sidewall of the recessed sacrificial semiconductor material nanosheet, and an outermost sidewall that is vertically aligned with the sidewalls of the first and second silicon channel material nanosheets (14NS, 18NS), the epitaxial oxide nanosheet 16NS, and the dielectric spacer material layer 22.

Figure 5:
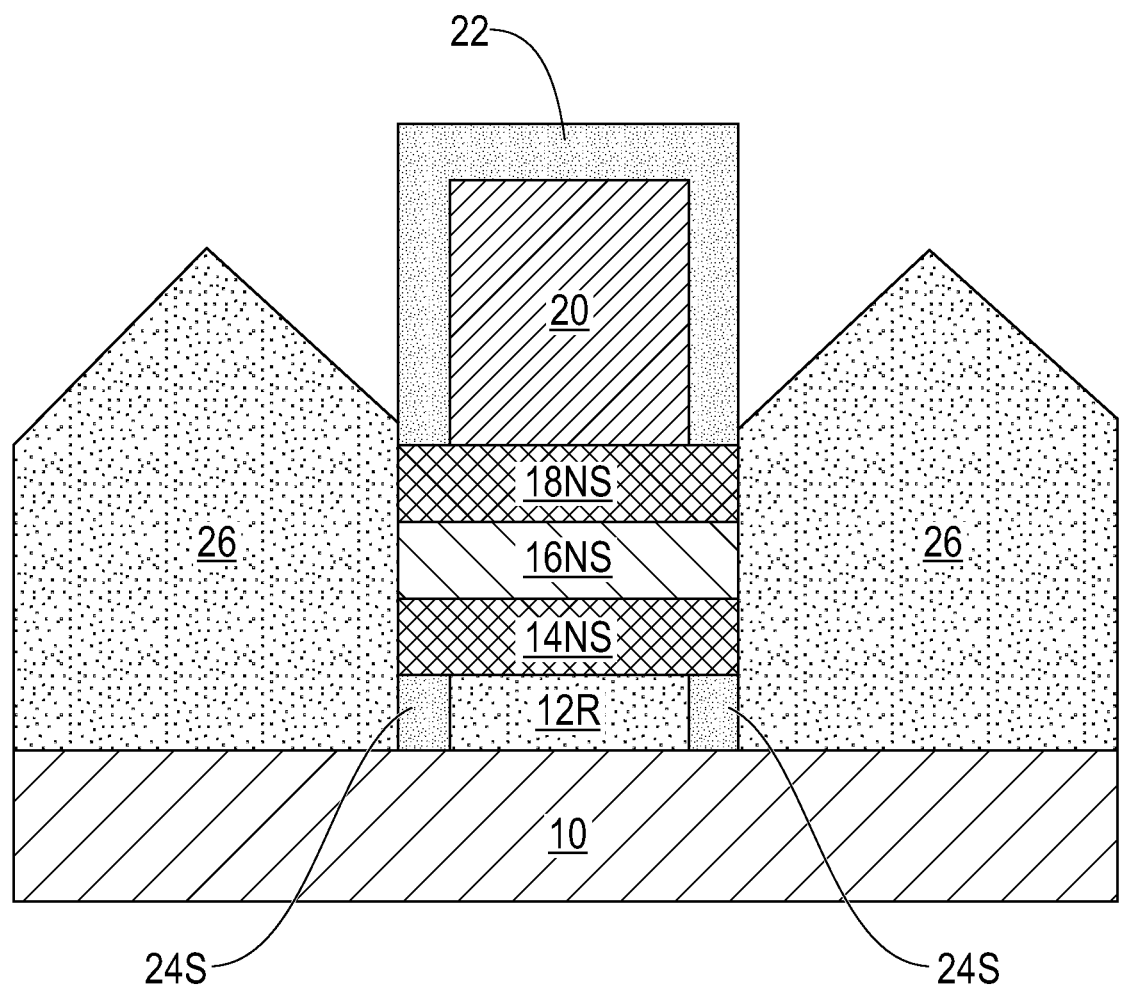
FIG. 5 is a cross sectional view of the exemplary semiconductor radiation monitor of FIG. 4 after forming a source/drain structure on each side of the nanosheet material stack.

Referring now to FIG. 5, there is illustrated the exemplary semiconductor radiation monitor of FIG. 4 after forming a source/drain structure 26 on each side of the nanosheet material stack. As is illustrated, the source/drain structure 26 is in direct physically contact with a physically exposed sidewall of the first silicon channel material nanosheet 14NS and a physically exposed sidewall of the second silicon channel material nanosheet 18NS. The source/drain structure 26 has a bottommost surface that may, or may not, be in direct physically contact with an exposed topmost surface of semiconductor substrate 10. In some embodiments and as shown in FIG. 5, the source/drain structure 26 may have a faceted (i.e., non-planar) topmost surface. In other embodiments (not shown), the source/drain structure 26 may have a planar topmost surface.

The source/drain structure 26 can be formed by epitaxial growth of a semiconductor material on physically exposed sidewalls of the first and second silicon channel material nanosheet (14NS, 18NS) and, optionally, upwards from the semiconductor substrate 10. The source/drain structure 26 includes a semiconductor material and a dopant. The semiconductor material that provides source/drain structure 26 can be selected from one of the semiconductor materials mentioned above for the semiconductor substrate 10. In some embodiments of the present application, the semiconductor material that provides source/drain structure 26 may be composed of silicon.

The dopant that is present in source/drain structure 26 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain structure 26 may have a dopant concentration of from $4\times10^{20}$ atoms/cm$^3$ to $3\times10^{21}$ atoms/cm$^3$. In one embodiment, the source/drain structure 26 is composed of phosphorous doped silicon. In another embodiment, the source/drain structure 26 is composed of a boron doped silicon germanium alloy.

In one embodiment, the dopant that can be present in the source/drain structure 26 can be introduced into the precursor gas that provides the source/drain structure 26. In another embodiment, the dopant can be introduced into an intrinsic semiconductor layer by utilizing one of ion implantation or gas phase doping.

Figure 6:
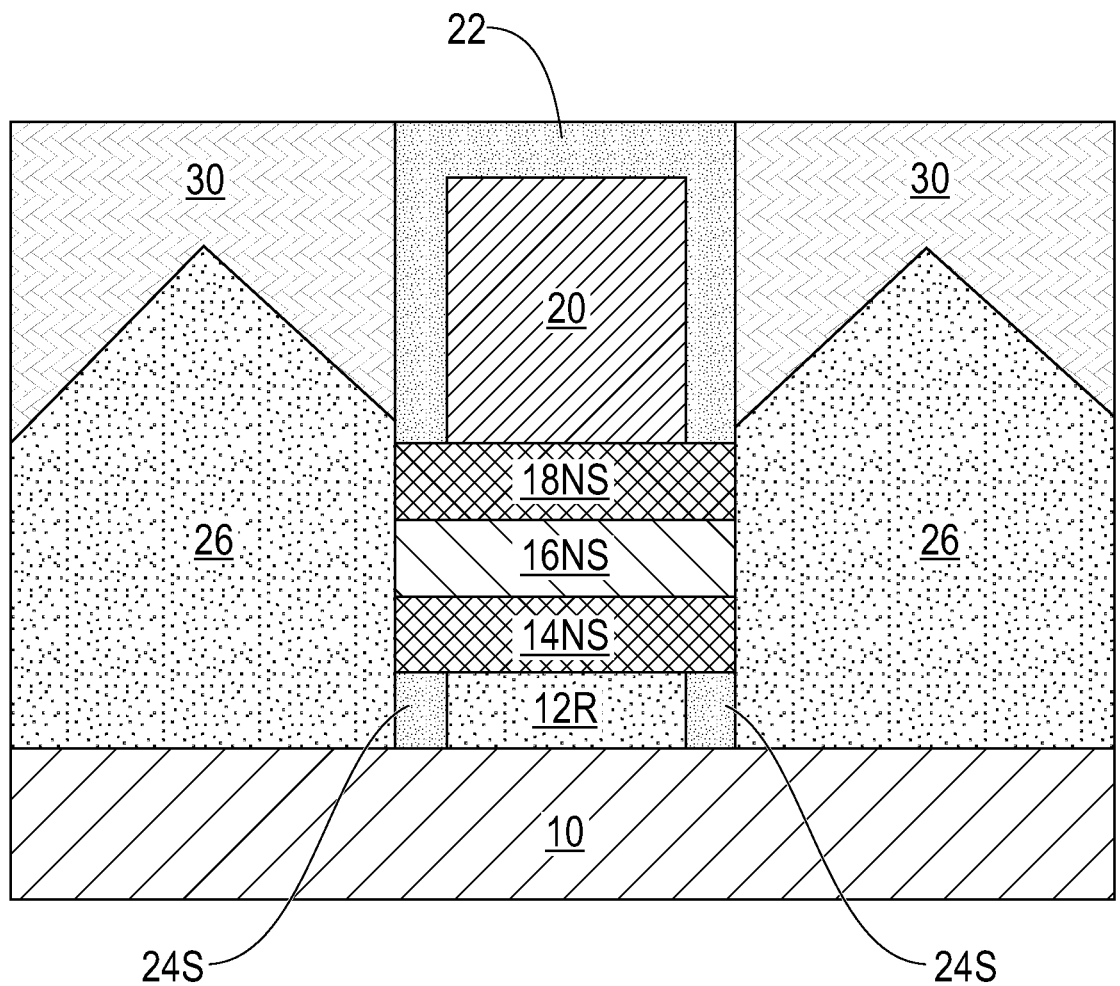
FIG. 6 is a cross sectional view of the exemplary semiconductor radiation monitor of FIG. 5 after forming an interlayer dielectric (ILD) material layer on the source/drain structure.

Referring now to FIG. 6, there is illustrated the exemplary semiconductor radiation monitor of FIG. 5 after forming an interlayer dielectric (ILD) material layer 30 on the source/drain structure 26. As is shown, the ILD material layer 30 has a topmost surface that is coplanar with a topmost surface of the dielectric spacer material layer 22.

The interlayer dielectric (ILD) material layer 30 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material layer 30. The use of a self-planarizing dielectric material as the ILD material layer 30 may avoid the need to perform a subsequent planarizing step.

In one embodiment, the ILD material layer 30 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material layer 30, a planarization process or an etch back process follows the deposition of the dielectric material that provides the ILD material layer 30.

Figure 7:
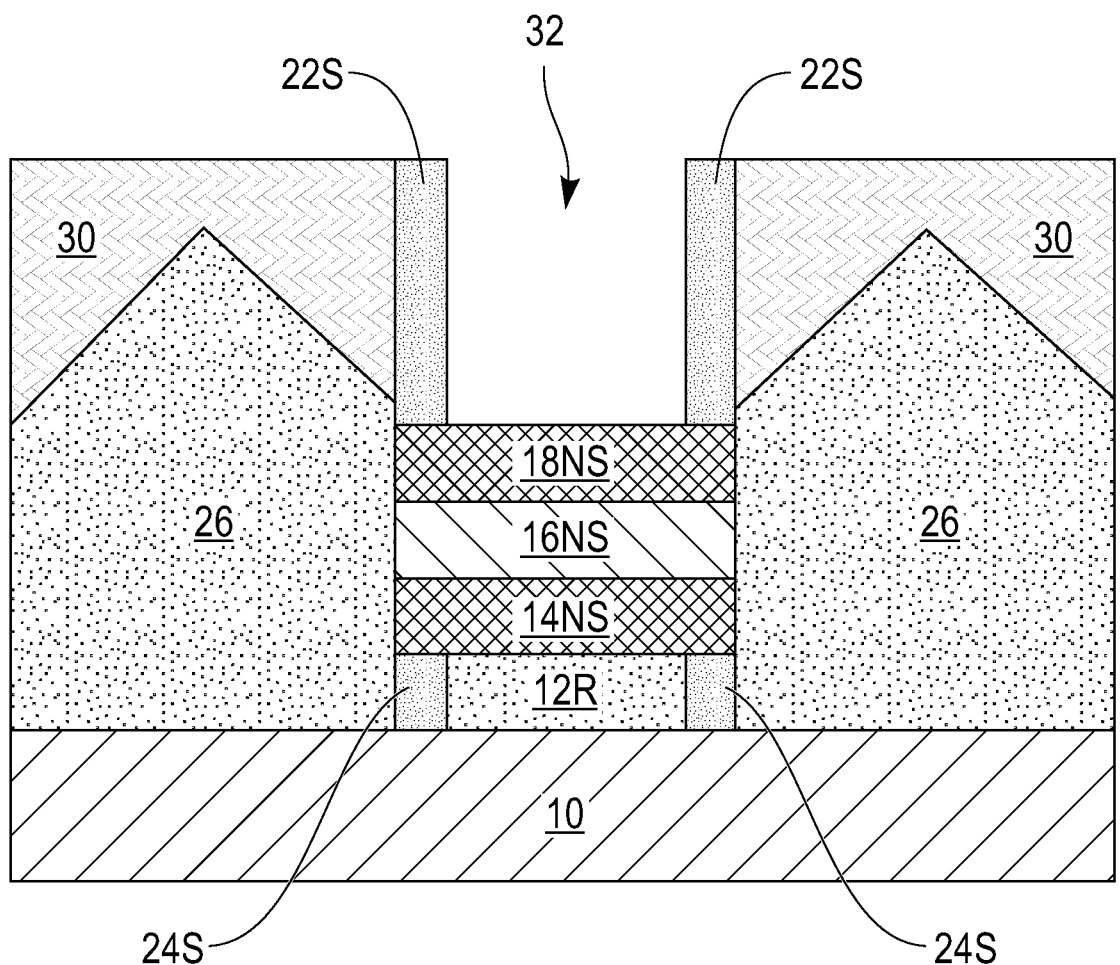
FIG. 7 is a cross sectional view of the exemplary semiconductor radiation monitor of FIG. 6 after removing the sacrificial gate structure.

Referring now to FIG. 7, there is illustrated the exemplary semiconductor radiation monitor of FIG. 6 after removing the sacrificial gate structure 20. Prior to removing the sacrificial gate structure 20, a horizontal portion of dielectric spacer material layer 22 is removed from atop the sacrificial gate structure 20 to provide a topmost inner gate spacer 22S.

The removal of the horizontal portion of the dielectric spacer material layer 22 and the sacrificial gate structure 20 can be performed utilizing one or more anisotropic etching processes. The removal of the sacrificial gate structure 20 provides an upper gate cavity 32.

Figure 8:
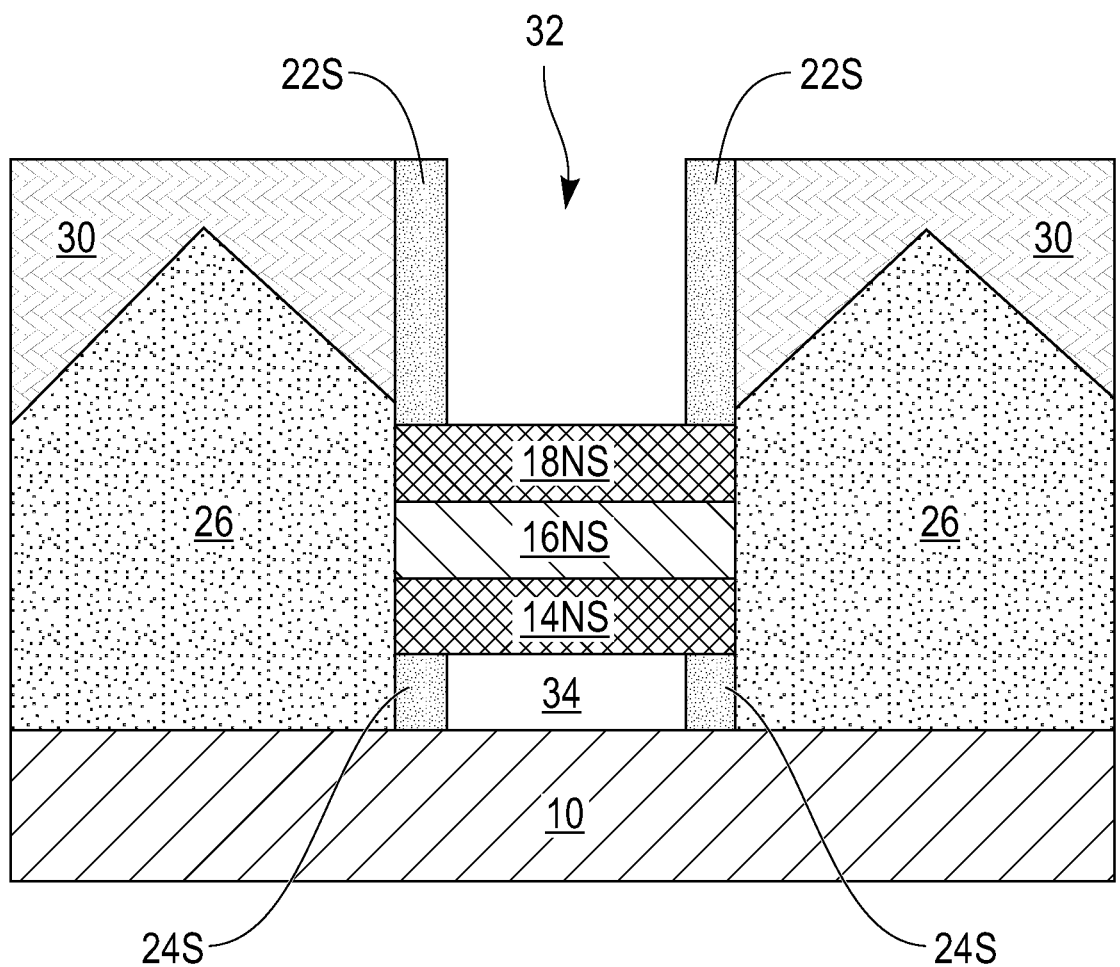
FIG. 8 is a cross sectional view of the exemplary semiconductor radiation monitor of FIG. 7 after removing the recessed sacrificial semiconductor material nanosheet.

Referring now to FIG. 8, there is illustrated the exemplary semiconductor radiation monitor of FIG. 7 after removing the recessed sacrificial semiconductor material nanosheet 12R. The recessed sacrificial semiconductor material nanosheet 12R can be removed by utilizing an etching process that is selective in removing the recessed sacrificial semiconductor material nanosheet 12R. After removing the recessed sacrificial semiconductor material nanosheet, a portion of the first silicon channel material nanosheet is suspended above the semiconductor substrate 10 and a lower gate cavity 34 is formed.

Figure 9:
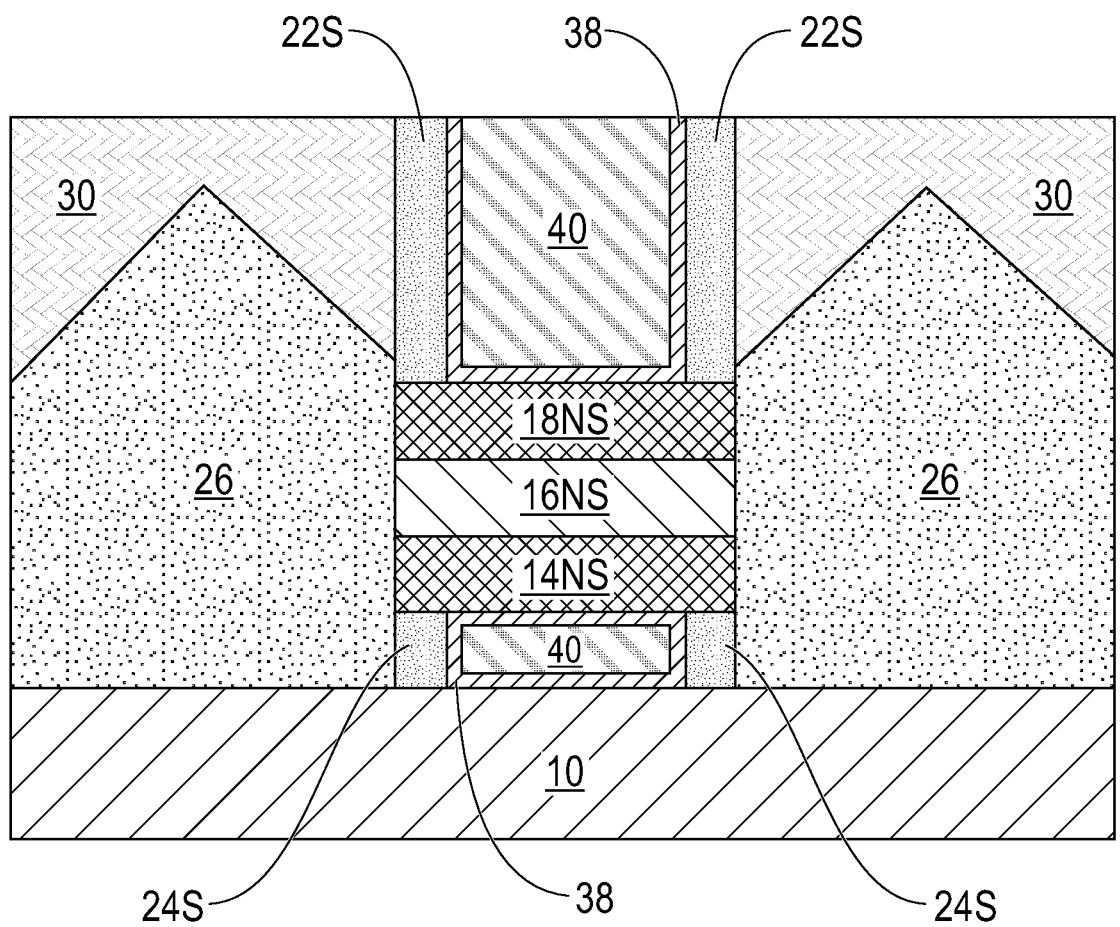
FIG. 9 is a cross sectional view of the exemplary semiconductor radiation monitor of FIG. 8 after forming a functional gate structure in an area previously containing the recessed sacrificial semiconductor material nanosheet and the area previously including the sacrificial gate structure.

Referring now to FIG. 9, there is illustrated the exemplary semiconductor radiation monitor of FIG. 8 after forming a functional gate structure (38, 40) in an area previously containing the recessed sacrificial semiconductor material nanosheet 12R (i.e., within the lower gate cavity 34) and the area previously including the sacrificial gate structure 20 (i.e., with the upper gate cavity 32). By "functional gate structure" it is meant a permanent gate structure used to control output current (i.e., flow of carriers in the channel) of a semiconducting device through electrical or magnetic fields.

The functional gate structure (38, 40) may include a gate dielectric portion 38 and a gate conductor portion 40. The gate dielectric portion 38 may include a gate dielectric material. The gate dielectric material that provides the gate dielectric portion 38 can be an oxide, nitride, and/or oxynitride. In one example, the gate dielectric material that provides the gate dielectric portion 38 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 38.

The gate dielectric material used in providing the gate dielectric portion 38 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric portion 38 can have a thickness in a range from 1 nm to 10 nm. Other thicknesses that are lesser than, or greater than, the aforementioned thickness range can also be employed for the gate dielectric material that may provide the gate dielectric portion 38.

The gate conductor portion 40 can include a gate conductor material. The gate conductor material used in providing the gate conductor portion 40 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor portion 34 may comprise an nFET gate metal. In another embodiment, the first gate conductor portion 40 may comprise a pFET gate metal.

The gate conductor material used in providing the gate conductor portion 40 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor portion 40 can have a thickness from 50 nm to 200 nm. Other thicknesses that are lesser than, or greater than, the aforementioned thickness range can also be employed for the gate conductor material used in providing the gate conductor portion 40.

The functional gate structure (38, 40) can be formed by providing a functional gate material stack of the gate dielectric material, and the gate conductor material. A planarization process may follow the formation of the functional gate material stack, and a recess etch may be used to remove the functional gate structure (38, 40) from the upper and lower gate cavities (32, 34). In the present application, a first FET is formed that includes the first silicon channel material nanosheet 14NS and the functional gate structure (38, 40) that is formed in the lower gate cavity 34, and a second FET is formed that includes the second silicon channel material nanosheet 18NS and the functional gate structure (38, 40) that is present in upper gate cavity 32. These two FETs share a common source/drain structure.

Figure 10:
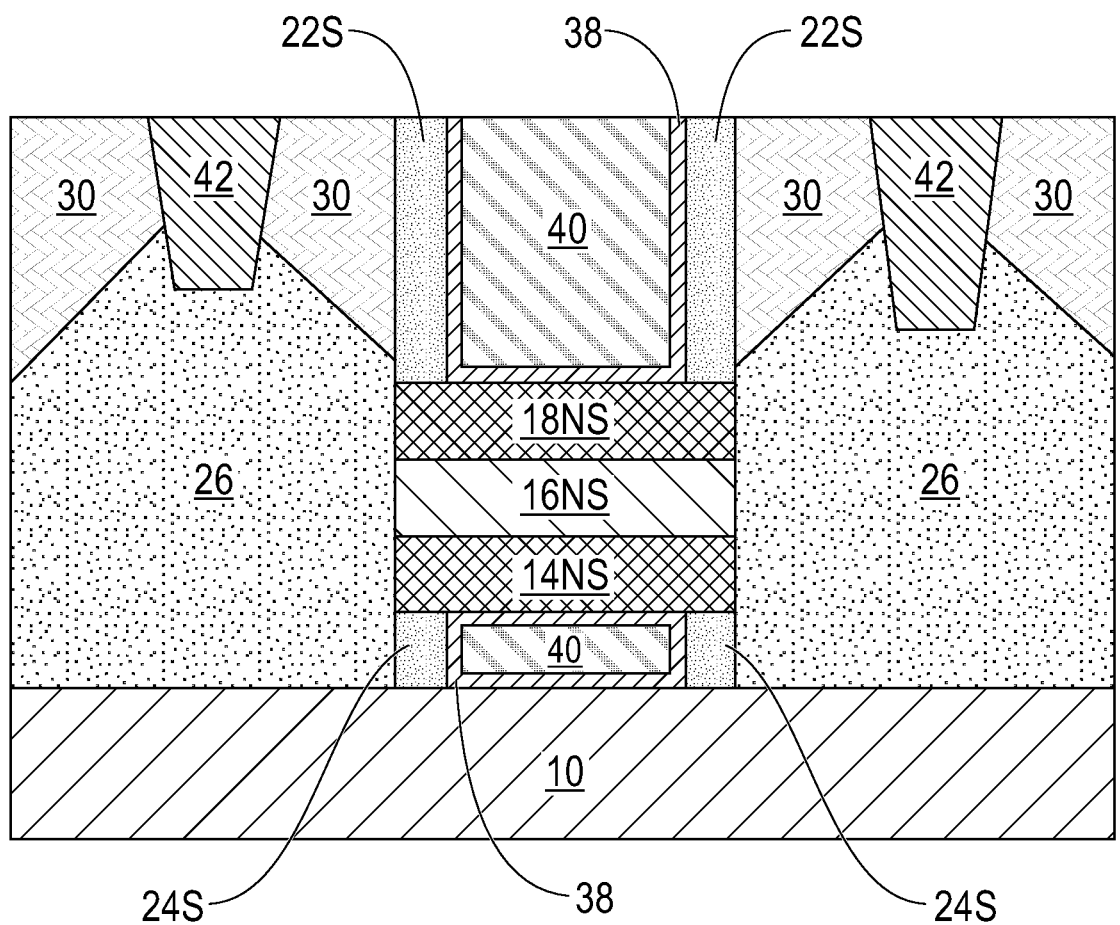
FIG. 10 is a cross sectional view of the exemplary semiconductor radiation monitor of FIG. 9 after forming contact structures.

Referring now to FIG. 10, there is illustrated the exemplary semiconductor radiation monitor of FIG. 9 after forming contact structures 42. Contact structures 42 can be formed by first providing contact openings to expose each source/drain structure 26 of the structure. The contact openings can be formed by lithography and etching. Each contact opening is then filled with a contact metal or metal alloy. Examples of contact metals include, but are not limited to, tungsten (W), aluminum (Al), copper (Cu), or cobalt (Co). An example of a contact metal alloy is Cu—Al alloy. A planarization process may follow the filling of each contact opening with the contact metal or metal alloy. The contact structures 42 are embedded in the ILD material layer 30.

FIG. 10 illustrates an exemplary semiconductor radiation monitor of the present application which includes nanosheet stack including a charge storage dielectric material nanosheet (i.e., the epitaxial oxide nanosheet 16NS) sandwiched between a first silicon channel material nanosheet 14NS and a second silicon channel material nanosheet 18NS, and suspended above a semiconductor substrate 10. A functional gate structure (38, 40) is located beneath the first silicon channel material nanosheet 14NS and above the second silicon channel material nanosheet 18NS. In this embodiment, the epitaxial oxide nanosheet 16NS, and the first and second silicon channel material nanosheets (14NS, 18NS) have a same width and thus the outermost sidewalls of each of epitaxial oxide nanosheet 16NS and the first and second silicon channel material nanosheets (14NS, 18NS) are vertically aligned to each other. In this embodiment, the first and second silicon channel material nanosheets (14NS, 18NS) share a common source/drain region 26. The radiation detection sensitivity of the semiconductor radiation monitor shown in FIG. 10 can be enhanced by varying the channel length (i.e., the width) of the silicon channel material nanosheets within the nanosheet stack.

The semiconductor radiation monitor shown in FIG. 10 detects radiation using the same detection mechanism as prior art FDSOI radiation monitors. For example, the semiconductor radiation monitor shown in FIG. 10 detects radiation by the shift in threshold voltage of the nanosheet FETs (including elements 38/40/14NS and 38/40/18NS) caused by the positive charges, which are created by ionizing radiations and trapped in the dielectric material nanosheet (i.e., epitaxial oxide nanosheet 16NS) between the Si channel material nanosheets (14NS and 18NS). Such a layered nanosheet structure is capable of detecting lower radiation doses than the planar FDSOI counterpart as both the top and bottom Si channel material nanosheets (14NS and 18NS) can sense the existence of the positive charges trapped in the epitaxial oxide nanosheet 16NS.

The semiconductor radiation monitor shown in FIG. 10 has the following additional benefits over prior art FDSOI radiation monitors. Firstly, the semiconductor radiation monitor shown in FIG. 10 has a tighter device density (larger surface area as compared to prior art FDSOI radiation monitors. Secondly, the semiconductor radiation monitor shown in FIG. 10 is capable of detecting a lower radiation dose (less than, or equal to 100 rads). Thirdly, the semiconductor radiation monitor shown in FIG. 10 can be fabricated at a lower cost than prior art FDSOI radiation monitors.

Figure 11:
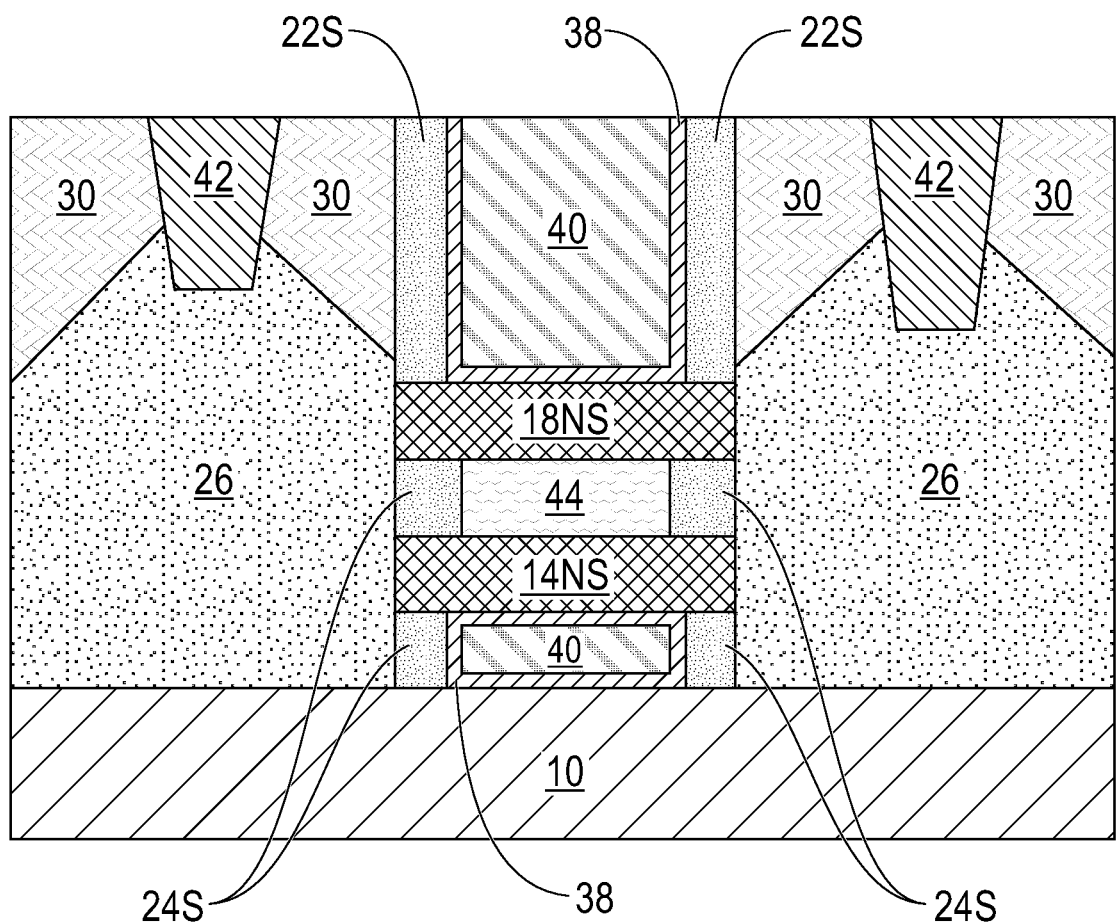
FIG. 11 is a cross sectional view of another exemplary semiconductor radiation monitor in accordance with the present application.

Referring now to FIG. 11, there is illustrated another exemplary semiconductor radiation monitor in accordance with the present application. The exemplary semiconductor radiation monitor shown in FIG. 11 is similar to the exemplary semiconductor radiation monitor shown in FIG. 10 except that the epitaxial oxide nanosheet 14NS (i.e., the charge storage dielectric material nanosheet) is replaced with a dielectric oxide material nanosheet 44 that is capable of storing positive charge upon use. In this embodiment, the dielectric oxide material nanosheet 44 has a width that is less than a width of the first and second silicon channel material nanosheets, and wherein an inner spacer 24S is located at the end of the charge storage dielectric material nanosheet 44.

The exemplary semiconductor radiation monitor shown in FIG. 11 can be formed by first forming a nanosheet material stack of, and from bottom to top, a first sacrificial silicon germanium alloy nanosheet having a first germanium content, a first silicon channel material nanosheet, a second sacrificial silicon germanium alloy nanosheet having a second germanium content that is greater than the first germanium content, and a second silicon channel material nanosheet on a surface of a semiconductor substrate and beneath a sacrificial gate structure and a dielectric spacer material layer. The second sacrificial silicon germanium alloy nanosheet replaces the epitaxial oxide nanosheet 16NS shown in FIG. 3, and such a nanosheet material stack can be formed utilizing the same processing steps as mentioned above in forming the structures shown in FIGS. 1-3 of the present application. In one embodiment, the first germanium content can be from 15 atomic percent germanium to 25 atomic percent germanium, while the second germanium content can be from 40 atomic percent germanium to 40 atomic percent germanium. As such, the sacrificial silicon germanium alloy nanosheets have different etch rates. Notably, the second sacrificial silicon germanium alloy nanosheet etches faster than the first sacrificial silicon germanium alloy nanosheet.

Next, the first and second sacrificial silicon germanium alloy nanosheets are recessed, as described above for providing the exemplary structure shown in FIG. 4, and inner spacer 24S is formed, as also described above. It is noted that the recessing provides a first gap between the first silicon channel material nanosheet and the semiconductor substrate, and a second gap, which is larger than the first gap, between the first and second silicon channel material nanosheets. It is further noted that the inner spacer 24S formed adjacent to the recessed second sacrificial silicon germanium alloy nanosheet will be wider than the inner spacer 24S formed adjacent to the recessed first sacrificial silicon germanium alloy nanosheet.

The source drain/structure 26 and the ILD material layer 30 are then formed as described above in providing the exemplary structures shown in FIGS. 5 and 6 of the present application. Next, the sacrificial gate structure is removed as described above in providing the exemplary structure shown in FIG. 7 of the present application. Following the removal of the sacrificial gate structure, the recessed second sacrificial silicon germanium alloy nanosheet is then removed, and thereafter the area previously occupied by the recessed second sacrificial silicon germanium alloy nanosheet is filled with a dielectric oxide such as, for example, $SiO_2$, SiON, $Al_2O_3$, SiNx, and BN. forming the dielectric oxide material nanosheet 44. The filling with the dielectric oxide may include deposition and a recess etch.

After providing the dielectric oxide material nanosheet 44, the recessed first silicon germanium alloy nanosheet is removed utilizing an etching process such that lower gate cavity is formed. Next, functional gate structure (38, 40) is formed as described above for providing the exemplary structure shown in FIG. 9, and thereafter contact structures 42 are formed as described above in providing the exemplary structure shown in FIG. 10.

The exemplary semiconductor radiation monitor shown in FIG. 11 works the same as the exemplary semiconductor radiation monitor shown in FIG. 10. The exemplary semiconductor radiation monitor shown in FIG. 11 has the same advantages as the exemplary semiconductor radiation monitor shown in FIG. 10.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor radiation monitor comprising:
a nanosheet stack comprising a charge storage dielectric material nanosheet sandwiched between a first silicon channel material nanosheet and a second silicon channel material nanosheet, and suspended above a semiconductor substrate, wherein the charge storage dielectric material nanosheet has a first surface that directly contacts a surface of the first silicon channel material nanosheet, and a second surface, opposite the first surface, that directly contacts a surface of the second silicon channel material nanosheet;

a functional gate structure located beneath the first silicon channel material nanosheet and above the second silicon channel material nanosheet;

a topmost inner spacer located laterally adjacent to the function gate structure that is located above the second silicon channel material nanosheet and having a bottommost surface directly contacting a topmost surface of the second silicon channel material nanosheet; and a lowermost inner spacer located laterally adjacent to the function gate structure that is located beneath the first silicon channel material nanosheet and having a topmost surface directly contacting a bottommost surface of the first silicon channel material nanosheet.

2. The semiconductor radiation monitor of claim 1, wherein the charge storage dielectric material nanosheet is lattice matched to the first and second silicon channel material nanosheets and is composed of an epitaxial oxide.

3. The semiconductor radiation monitor of claim 2, wherein the epitaxial oxide is composed of lanthanum (II) oxide, gadolinium(III)-oxide, dysprosium(III)-oxide, holmium(III) oxide, erbium (III) oxide, thulium (III) oxide, lutetium(III) oxide, cerium (IV) oxide, lanthanum-yttrium oxide, gadolinium-erbium oxide, neodymium-erbium oxide, neodymium-gadolinium oxide, or lanthanum-erbium oxide.

4. The semiconductor radiation monitor of claim 1, wherein the charge storage dielectric material nanosheet has a same width as the first and second silicon channel material nanosheets.

5. The semiconductor radiation monitor of claim 1, wherein charge storage dielectric material nanosheet is composed of a dielectric oxide and has width that is less than a width of the first and second silicon channel material nanosheets, and wherein an intermediate inner spacer is located at the end of the charge storage dielectric material nanosheet.

6. The semiconductor structure of claim 1, further comprising a source/drain structure on each side of the nanosheet stack and in direct physically contact with a sidewall of the first silicon channel material nanosheet and in direct physical contact with a sidewall of the second silicon channel material nanosheet.

7. The semiconductor radiation monitor of claim 6, wherein the source/drain structure has a faceted topmost surface.

8. The semiconductor radiation monitor of claim 6, further comprising a contact structure contacting a surface of each source/drain structure.

9. The semiconductor radiation monitor of claim 8, wherein each contact structure is located within an interlayer dielectric material layer.

* * * * *